United States Patent [19]
Patrick et al.

[11] Patent Number: 5,401,350
[45] Date of Patent: Mar. 28, 1995

[54] COIL CONFIGURATIONS FOR IMPROVED UNIFORMITY IN INDUCTIVELY COUPLED PLASMA SYSTEMS

[75] Inventors: Roger Patrick, Santa Clara, Calif.; Frank Bose, Wettingen, Switzerland; Philippe Schoenborn, San Jose; Harry Toda, Santa Clara, both of Calif.

[73] Assignee: LSI Logic Corporation, Milpitas, Calif.

[21] Appl. No.: 27,995

[22] Filed: Mar. 8, 1993

[51] Int. Cl.6 ............................................. H05H 1/00
[52] U.S. Cl. ................................... 156/345; 156/643; 118/723 I; 204/298.06; 204/298.34
[58] Field of Search ................................ 156/345, 643; 118/723 I, 723 IR; 204/298.34, 298.06; 315/111.41, 111.21

[56] References Cited

U.S. PATENT DOCUMENTS

| | | | |
|---|---|---|---|
| 5,226,967 | 7/1993 | Chen et al. | 156/345 X |
| 5,234,529 | 8/1993 | Johnson | 156/345 |
| 5,241,245 | 8/1993 | Barnes et al. | 156/643 X |

Primary Examiner—Thi Dang

[57] ABSTRACT

The present invention relates to an apparatus for generating a low pressure plasma circulating in a planar direction within a process enclosure. The invention generates plasma having substantially uniform density characteristics across a planar axis. The invention achieves improved uniformity of the plasma density by delivering more radio frequency power toward the periphery of the circulating plasma than toward the center of the plasma. Increasing the periphery power to the circulating plasma compensates for increased plasma losses due to interaction with the side walls of the process containment enclosure.

8 Claims, 14 Drawing Sheets

COIL CONFIGURATIONS FOR IMPROVED UNIFORMITY IN INDUCTIVELY COUPLED PLASMA SYSTEMS

BACKGROUND OF THE INVENTION

1. Field of the Invention

The present invention relates to low pressure plasma generation systems and, more particularly, to coil configurations for improving plasma uniformity in a plasma generation system.

2. Description of the Related Technology

Ionized gas or "plasma" may be used during processing and fabrication of semiconductor devices. Plasma is used to etch or remove material from semiconductor integrated circuit wafers. Plasma may also be used to deposit or sputter material onto integrated circuit wafers. Use of plasma gases in the fabrication of integrated circuits is widespread in the semiconductor manufacturing industry.

During fabrication, a semiconductor integrated circuit wafer may require materials to be added or removed, or selectively etched through a mask. To use plasma in the integrated circuit fabrication process, typically, a low pressure process gas is introduced into a process vessel chamber surrounding an integrated circuit wafer. The process vessel is used to maintain the low pressures required for the plasma and to serve as a structure for attachment of the energy source. The process gas is ionized into a plasma by the energy source, either before or after entering the chamber, and the plasma flows over the semiconductor integrated circuit wafer.

Ideally, uniformly ionized plasma would flow over the entire surface of the wafer. Any difference in the plasma ionization strength will cause uneven reaction characteristics along the surface of the wafer. Uneven reaction characteristics may cause problems when etching thin films associated with semiconductor manufacturing. Some of the problems created are etch rate non-uniformity across a substrate from edge to center, profile or line width variation across the substrate, and semiconductor device damage.

Plasma may be created from a low pressure process gas by inducing an electron flow which ionizes individual gas molecules through the transfer of kinetic energy through individual electron-gas molecule collisions. Various methods of inducing an electron flow in the process gas are well known to those skilled in the art. Typically, electrons are accelerated in an electric field such as one produced by radio frequency energy. Low frequencies (below 550 KHz), high frequencies (13.56 MHz), or microwaves (2.45 GHz).

Using microwave radio frequency energy to generate plasma has the advantage of more readily transferring energy to the process gas rather than to surrounding objects such as the walls of a process chamber or the semiconductor wafer. Another way of generating a plasma is with an electron cyclotron resonance (ECR) system. The ECR system requires a controlled magnetic field to induce circular electron energy into the process gas and not into the process chamber walls.

Other methods for improving the efficiency of plasma generation are magnetically enhanced plasma generation systems and inductively coupled electron acceleration, more commonly called inductively coupled plasma. Magnetically enhanced plasma systems use a constant magnetic field parallel to the integrated circuit wafer surface and a high frequency electric field perpendicular to the wafer surface. The combined magnetic and electric forces cause the electrons to follow a cycloidal path, thus, increasing the distance the electrons travel relative to the more direct straight path induced by the electric field alone. A major drawback in using a magnetic field to increase the electron travel distances is the requirement of a strong magnetic field which is both costly and difficult to maintain.

In the inductively coupled plasma process, the electrons also follow an extended circular path. Two techniques may be used to generate plasma by inductive coupling, both of which use alternating current to transfer energy to the gas by transformer coupling. The first technique utilizes a ferrite magnetic core to enhance transformer coupling between primary and secondary windings, and uses low frequencies, for example, below 550 KHz. The second technique uses a solenoid coil surrounding the gas to be ionized. This technique may use either low frequencies or high frequencies in the range of 13.56 MHz. Neither of these techniques provides a uniform plasma proximate and substantially parallel with the surface of an integrated circuit wafer.

U.S. Pat. No. 4,948,458 describes a method and apparatus for obtaining a more uniform and substantially parallel (planar) plasma for use during processing of integrated circuit wafers. The invention disclosed in this patent comprises an enclosure having an interior bounded at least in part by a radio frequency transparent window. A planar coil is disposed proximate to the window, and a radio frequency energy source is coupled through an impedance matching circuit to the coil. The planar coil radiates the radio frequency energy such that a planar magnetic field is induced in the interior of the enclosure. This planar magnetic field causes a circulating flow of electrons to be induced into the process gas.

The circulating flow allows the electrons to travel a path a much greater distance before striking the enclosure. The circulating electrons flow is substantially planar and has minimal kinetic energy in the non-planar direction. The planar coil is substantially parallel with a support surface. The support surface, therefore, is oriented substantially parallel to the circulating electron flow and is adapted to hold a semiconductor integrated circuit wafer during process fabrication. Thus, the support surface holds the semiconductor wafer substantially parallel to the electron flow.

The purpose of the invention disclosed in the above mentioned patent is to generally limit the wafer treatment to only the chemical interaction of the plasma species with the integrated circuit wafer. This is accomplished by minimizing the kinetic velocity of the plasma flux in the non-planar direction, thus reducing the kinetic impact on the wafer.

Referring to FIGS. 1 and 2, isometric and cross-sectional views of the prior art, respectively, are illustrated schematically. A plasma treatment system 10, for etching individual semiconductor wafers W, includes an enclosure 12 having an access port 14 formed in an upper wall 16. A radio frequency transparent window 18 is disposed below the upper wall 16 and extends across the access port 14. The window 18 is sealed to the wall 16 to define a vacuum-tight interior 19 of the enclosure 12.

A planar coil 20 is disposed within the access port 14 adjacent to the window 18. Coil 20 is formed as a spiral having a center tap 22 and an outer tap 24. The plane of the coil 20 is oriented parallel to both the window 18 and a support surface 13 upon which the wafer W is mounted. In this way, the coil 20 is able to produce a planar plasma within the interior 19 of the enclosure 12 which is parallel to the wafer W.

Referring now to FIGS. 1-3, the planar coil 20 is driven by a radio frequency (RF) generator 30. The output of the generator 30 is fed by a coaxial cable 32 to a matching circuit 34. The matching circuit 34 includes a primary coil 36 and a secondary loop 38 which may be mutually positioned to adjust the effective coupling of the circuit and allow for loading of the circuit at the frequency of operation. Conveniently, the primary coil 36 is mounted on a disk 40 which may be rotated about a vertical axis 42 in order to adjust the coupling therebetween.

A variable capacitor 44 is also provided in series with the secondary loop 38 in order to adjust the circuit resonant frequency with the frequency output of the RF generator 30. Impedance matching maximizes the efficiency of power transfer to the planar coil 20. An additional capacitor 46 is provided in the primary circuit in order to cancel part of the inductive reactance of coil 36 in the circuit.

Referring now to FIGS. 2 and 4, process gas is introduced into the interior 19 of the enclosure 12 through a port 50 formed through the side of the enclosure 12. The gas is introduced at a point which provides for distribution throughout the interior 19.

The flat spiral coil 20 may consist of equally spaced turns. Referring to FIG. 8, a graph representing test measurements of the current density versus position relative to the center of an equally spaced planar coil is illustrated. The graph of FIG. 8 illustrates maximum plasma density at or near the center of the equally spaced planar coil. This is also described in U.S. Pat. No. 4,948,458, column 6, lines 35 to 41.

Further tests, however, indicate that the equally spaced turns of the coil create a non-uniformity in the plasma generated. This is so because the side walls of the enclosure 12 cause more losses to the periphery of the plasma than toward the center of the plasma. Referring to FIG. 9, the current density versus position of an unmodified equally spaced spiral planar coil and a modified planar coil having unequal spacing of the turns, is illustrated. The current density 90 of the unmodified coil has a lower current density at the outer periphery 92 and 94 than does the modified coil current density 96. Thus, in contrast to the invention claimed in U.S. Pat. No. 4,948,458, a more uniform plasma over the entire surface of the semiconductor wafer requires not more but less RF power near the center of a planar spiral wound coil.

SUMMARY OF THE INVENTION

The present invention utilizes new, novel and non-obvious coil configurations for the purpose of enhancing the RF power delivered toward the periphery of the circulating plasma and reducing the RF power delivered toward the center of the plasma. By delivering inversely gradiated RF power to the plasma stream, a more uniform plasma density results in practice. The present invention more effectively compensates for loss of plasma at the walls of the enclosure without creating plasma "hot spots" toward the center of the plasma that lead to problems in etching of thin films. These problems may include etch rate non-uniformity across the wafer from edge to center, profile or line width variation across the wafer from edge to center, and possible wafer surface damage.

The present invention utilizes a non-uniformly wound planar coil or coils to create a current density in the plasma such that the plasma has consistently even characteristics from the periphery to the center of the surface of a semiconductor wafer. A number of embodiments may be utilized to produce the required current density throughout the plasma.

Unevenly Spaced Spiral Coil

A non-uniformly spaced spiral coil having wider spacing between the turns toward the center and closer spacing of the turns toward the outside radius of the coil is illustrated in FIG. 10. The more closely spaced turns toward the outside of the coil create a higher density radio frequency field than the field produced by the wider spaced turns toward the center of the coil. By careful selection of the number of turns of the coil and the various spacings between the different turns, a current density may be configured that results in a uniform plasma density across the entire working surface of the enclosure. This is especially important when processing the newer eight inch diameter semiconductor wafers, flat panel displays and future larger diameter semiconductor wafers.

Radio frequency power from an RF source is coupled to a matching network by means of coaxial cable. The matching network is used to insure maximum transfer of RF power from the source into the coil. The transferred RF power is radiated from the matched coil into the process gas flowing into the work chamber where the gas becomes plasma.

An object of the present invention is to compensate for plasma energy loss near the side walls of the enclosure by having more RF energy available toward the circumference of the plasma than toward the center. This results in the plasma having a uniform energy density throughout.

Doughnut Coil Configuration

A partially spiral coil in the form of a doughnut having coil turns predominately toward the outside radius of the coil is illustrated in FIG. 11. The turns in doughnut coil configuration create a higher density radio frequency field around the periphery of the coil. By careful selection of the number of turns of the coil and the turn spacing, a current density may be configured that results in a uniform plasma density across the entire working surface of the enclosure.

In similar fashion to the non-uniform spiral coil described above, radio frequency power from an RF source is coupled to a matching network by means of coaxial cable. The matching network is used to insure maximum transfer of RF power from the source into the coil. The transferred RF power is radiated from the matched coil into the process gas flowing into the work chamber where the gas becomes plasma.

Doughnut Coil Plus Separate Independently Powered Center Coil

A partially spiral doughnut shaped exterior coil and an interior coil concentric to the exterior coil, both having separate RF sources, are illustrated in FIG. 12. The exterior and interior coils allow a current density pattern to be created that generates a uniform plasma field by adjusting each of the respective power sources.

The power of each power source may be independently adjusted for best current density pattern. Each RF source may be phase locked together so as to maintain the same frequency. Phasing of the two RF sources may be adjusted over a 0-180 degree range for fine tuning of the resulting plasma density. Individual matching networks are used to insure maximum transfer of power from the respective RF power sources to respective coils.

A single RF power source may be utilized with the two coil embodiment of the present invention. FIG. 12a illustrates a simplified schematic block diagram of the single RF power source embodiment. The power source connects to a RF power divider which supplies a portion of the RF power source to each matching network. The power divider may be utilized to balance the power distribution between the interior and exterior coils. Phasing between coils may be varied over a 0-180 degree range by varying the length of one of the coaxial cables between the RF power divider and the respective matching networks.

Spiral Coil With Moveable Tap

A spiral coil having an adjustable tap connected to an RF power source is illustrated in FIG. 13. The adjustment of the coil tap results in a radio frequency field that results in a uniform plasma density across the entire working surface of the enclosure. The RF power flows mainly between the tap connection and ground. The ungrounded portion of the coil does not radiate a significant amount of RF power but may produce a phase inversion feedback that beneficially modifies the RF current density toward the center of the tapped coil.

Radio frequency power from an RF source is coupled to a matching network by means of coaxial cable. The matching network is used to insure maximum transfer of RF power from the source into the coil. The transferred RF power is radiated from the matched coil into the process gas flowing into the work chamber where the gas becomes plasma.

An object of the present invention is to easily adjust a planar coil so as to compensate for plasma energy loss near the side walls of the enclosure by having more RF energy available toward the circumference of the plasma than toward the center.

Additional Independently Powered coil Around Exterior Wall of Plasma Chamber

As illustrated in FIG. 14, a spiral coil may be placed on top of the chamber housing and a side coil may be placed around the side wall of the chamber biased toward the top coil. Independent RF power sources may be utilized for adjusting the amount of RF introduced into the chamber interior for creation of the plasma. The two power sources may be phase locked together to maintain the same frequency. Phase adjustment of 0-180 degrees may be made between the two RF sources by phase adjustment means well known in the art of signal generators and transmission lines. One RF power source, a power divider and coaxial phasing lines may also be utilized as illustrated in FIG. 12a.

The side coil adds RF energy to the outer circumference of the plasma field where there is the most plasma energy loss due to side wall absorption. Matching networks are utilized for maximum power transfer from the RF power sources which may be, for example, 50 ohms impedance. The matching networks adjust the impedance of the respective coils to match the typical 50 ohm impedance of the coaxial cable used to connect the RF power source to the matching network.

A third RF power source may be connected to the wafer support surface to impart plasma energy in the tangential direction to the wafer surface. RF frequencies in the high frequency region of 13.56 MHz, the microwave region of 2.45 GHz, or the low frequency region below 540 KHz may be utilized separately, or in combination, to produce a desired result during processing of the integrated circuit wafer or other objects such as, for example, flat screen display panels.

S-Shaped Coil

An S shaped coil is illustrated in FIG. 15. This S shaped coil more evenly distributes the RF energy into the process gas than does a circular spiral coil. The S shaped coil may be utilized at microwave (2.45 Ghz) or high frequency (13.56 MHz). Adjustment of the spacing between the coils may be used to adjust the RF radiation pattern into the process gas to create the uniformly energized plasma. A matching network and RF source which function as mentioned above are also illustrated.

Other and further objects, features and advantages will be apparent from the following description of presently preferred embodiments of the invention, given for the purpose of disclosure and taken in conjunction with the accompanying drawings.

DESCRIPTION OF THE PREFERRED EMBODIMENTS

Figure 1:
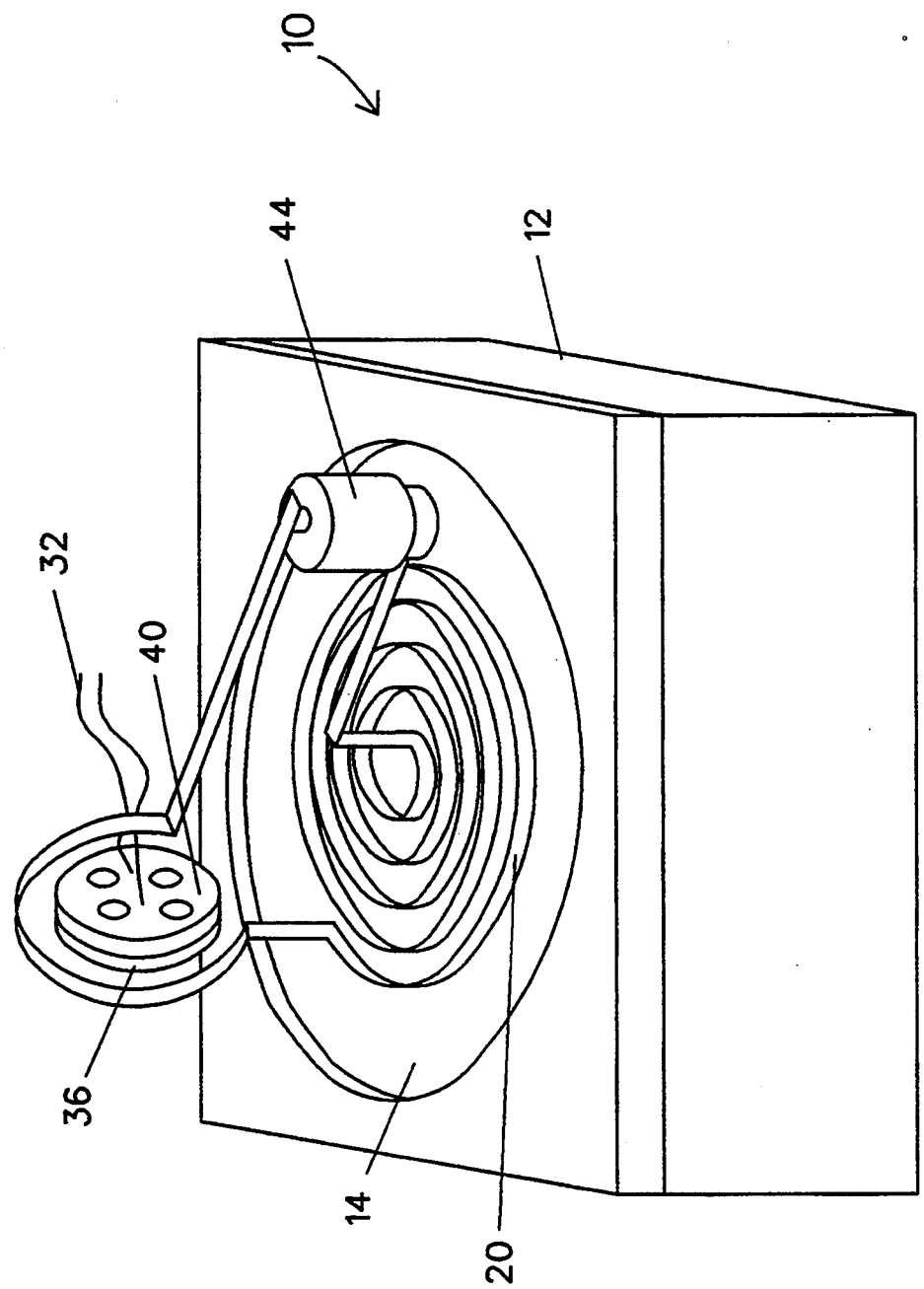
FIG. 1 is an isometric view of a prior art apparatus for producing a planar plasma.

The development and characterization of uniform, large area, high density plasma sources capable of clean and rapid processing of integrated circuit substrates is crucial to the semiconductor industry. The present invention is used in a radio frequency induction (RFI) plasma processing system. The RFI system is used to economically produce a uniform planar plasma during the process fabrication of modern integrated circuit semiconductor wafers.

Referring now to the drawings, the details of the preferred embodiments are schematically illustrated. In the drawings, the letter C designates generally an apparatus for enhancing the RF power delivered toward the periphery of the circulating plasma and reducing the RF power delivered toward the center of the plasma. Like elements are numbered the same, and similar elements are represented by the same number and a different lower case letter thereafter.

Non-Uniformly Spaced Spiral Coil

Figure 10:
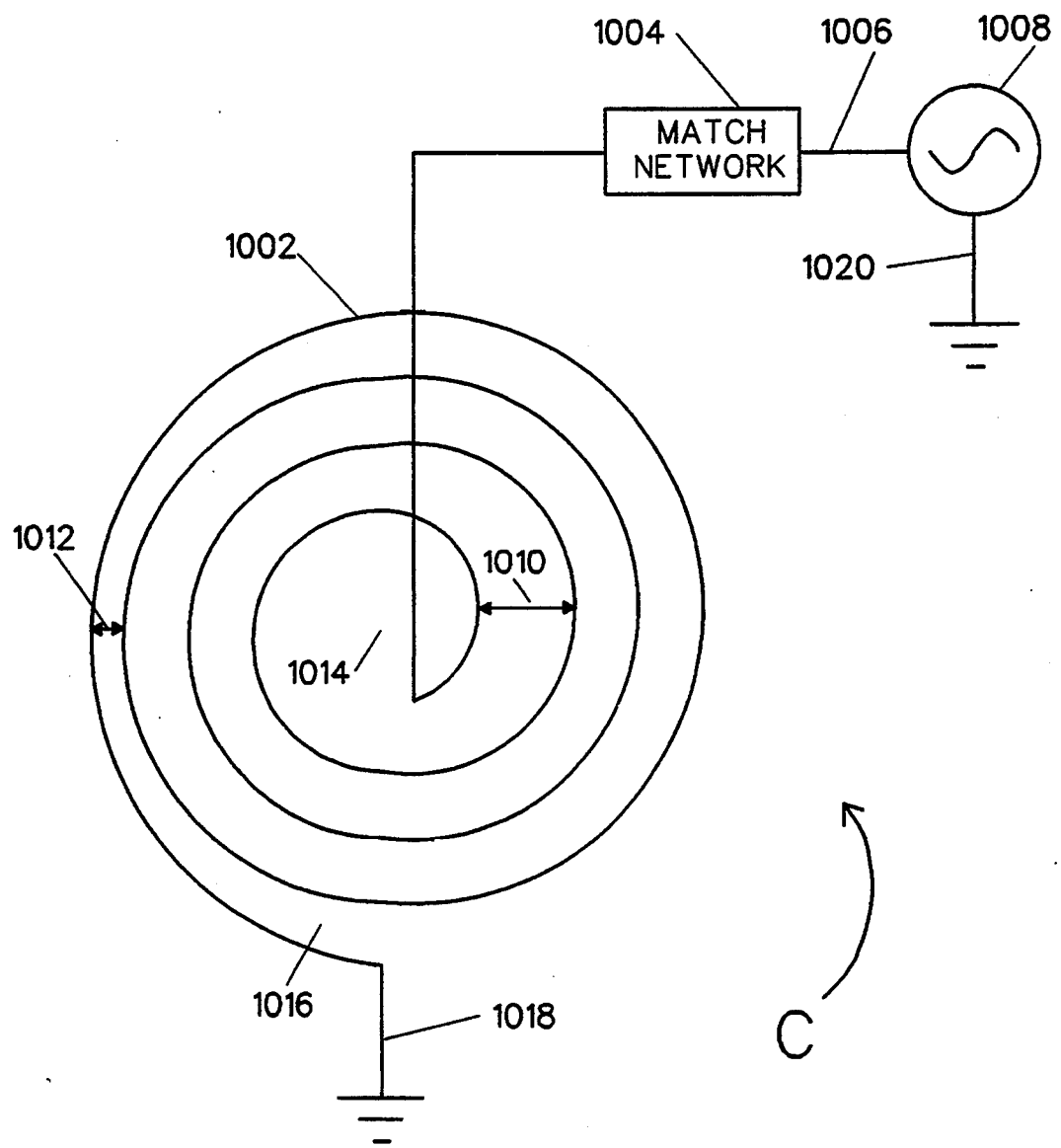
FIG. 10 is a schematic block diagram of a non-uniformly spaced spiral coil embodiment of the present invention.

Referring now to FIG. 10, a non-uniformly spaced spiral coil embodiment of the present invention is illustrated schematically. An RF generation system having even distribution of RF energy for creating a planar gas plasma is generally referenced by the letter C. The RF generation system C comprises a non-uniformly spaced spiral coil 1002, an impedance matching network 1004, coaxial cable feed line 1006 and an RF power source 1008. Power source 1008 typically has an output power of from 100 to 2000 watts into a 50 ohm load. Coaxial cable 1006 may have 50 ohm impedance and have a power handling capacity at the frequency of use sufficient for the RF source 1008. The cable 1006 feeds RF power from the source 1008 to the matching network 1004. Network 1004 is used to obtain a proper match to the coaxial cable 1006 and source 1008.

Figure 2:
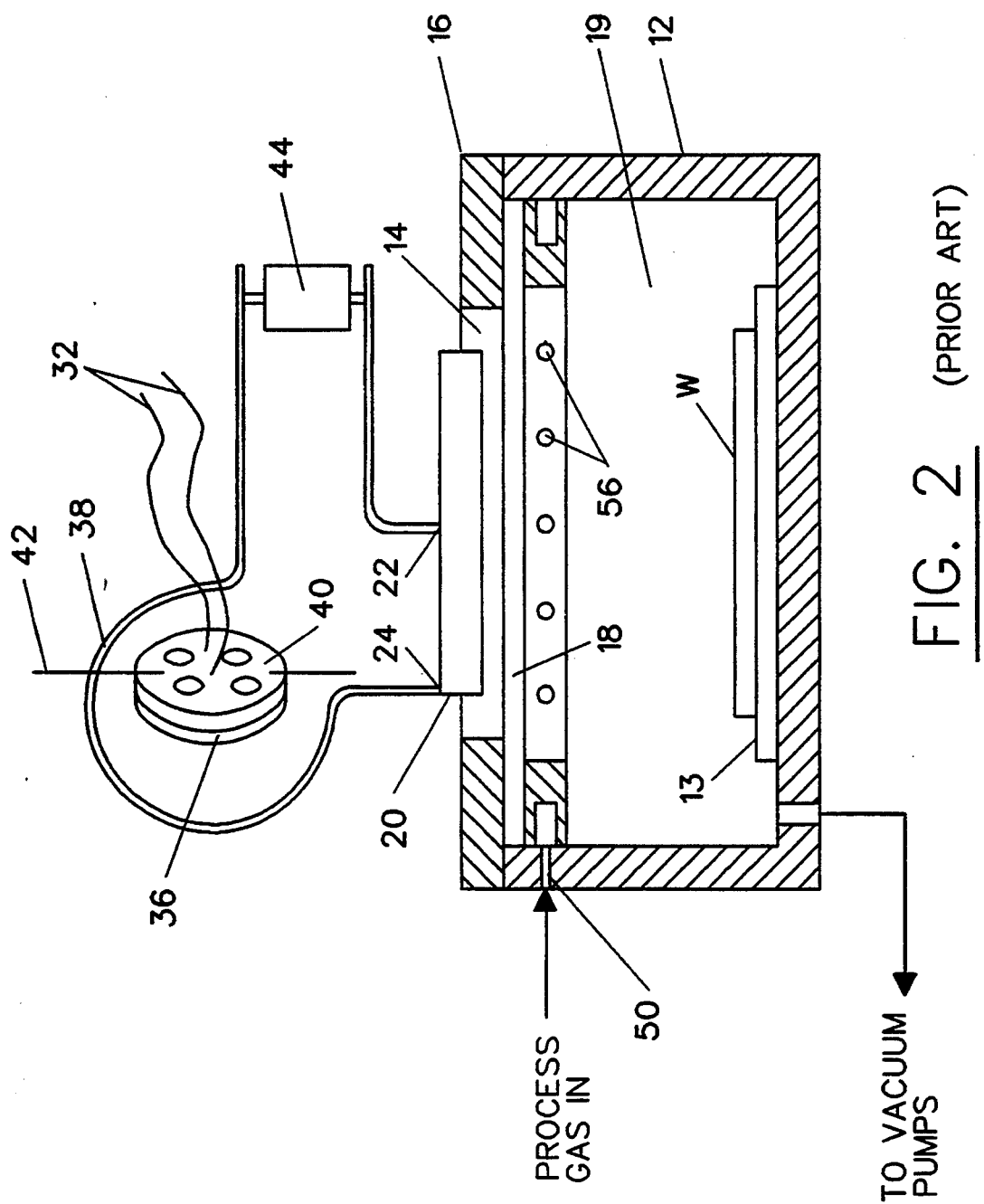
FIG. 2 is a cross-sectional view of the apparatus of FIG. 1.
Figure 3:
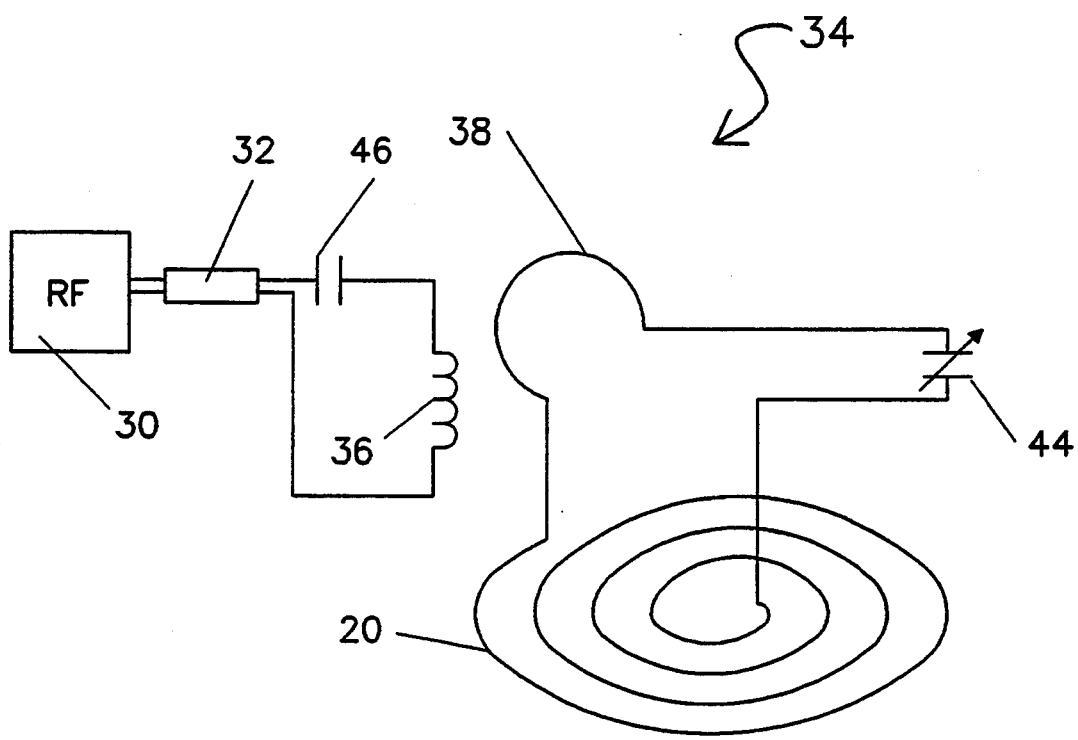
FIG. 3 is a schematic view of the circuitry of the apparatus of FIG. 1.
Figure 4:
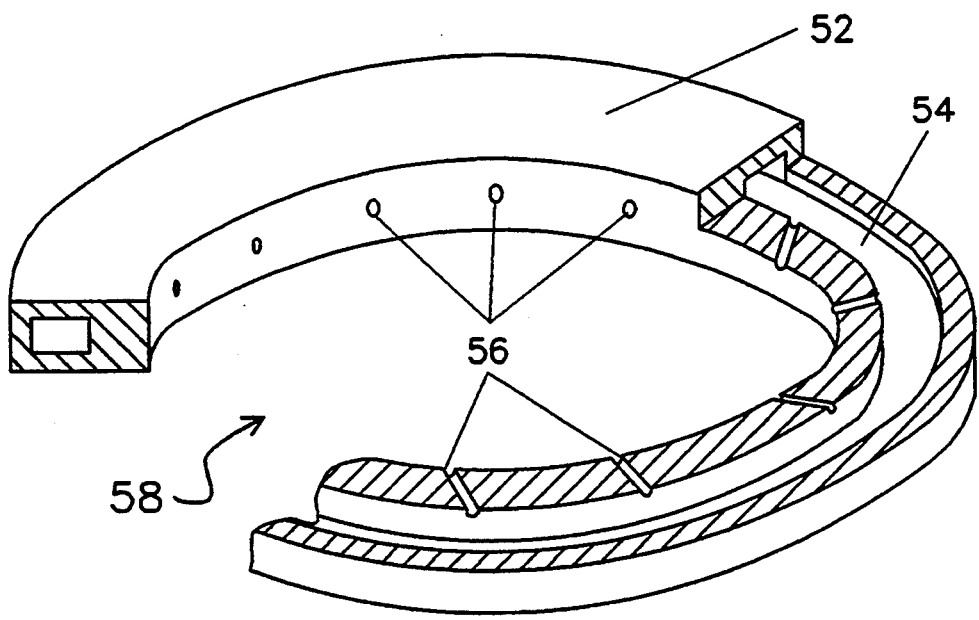
FIG. 4 is a detailed view of a process gas introducing ring employed in the apparatus of FIG. 1.
Figure 5:
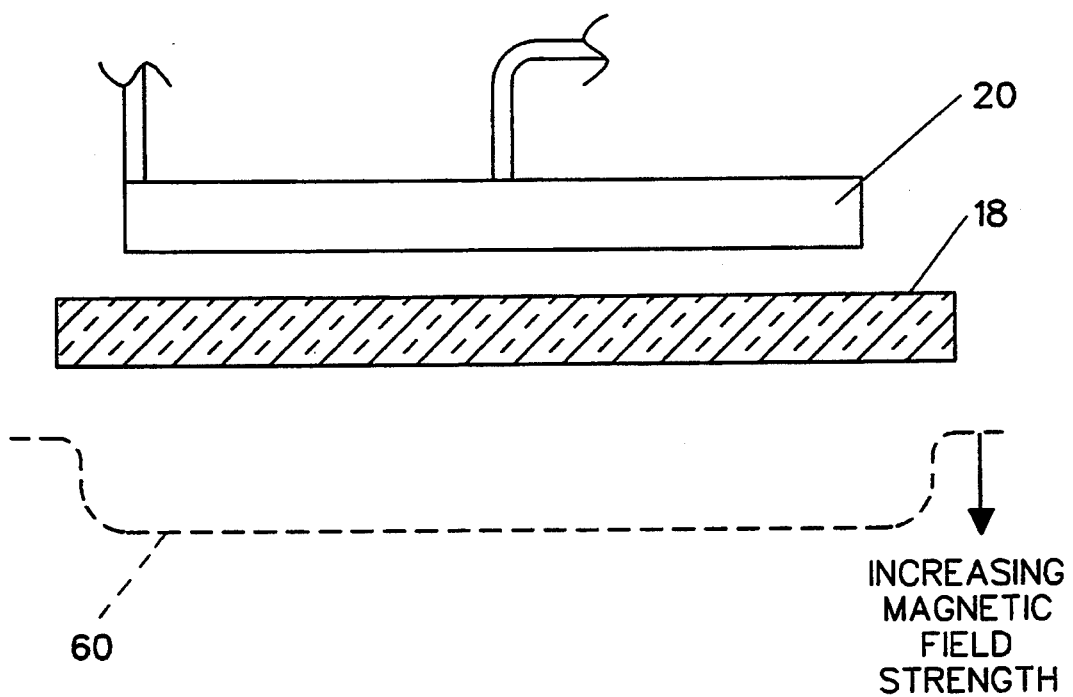
FIG. 5 is a partial elevational view illustrating the magnetic field strength produced by the apparatus of FIGS. 1 and 2.
Figure 6:
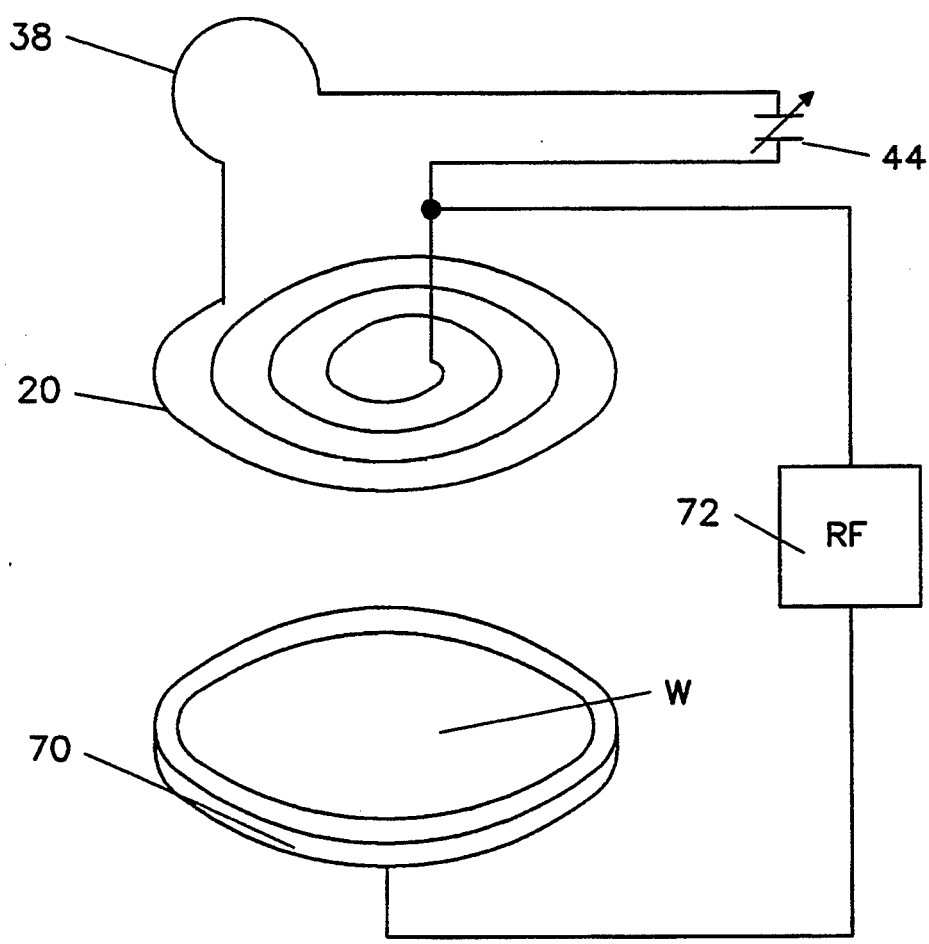
FIGS. 6 and 7 are schematic views of prior art apparatus for producing a planar plasma.
Figure 7:
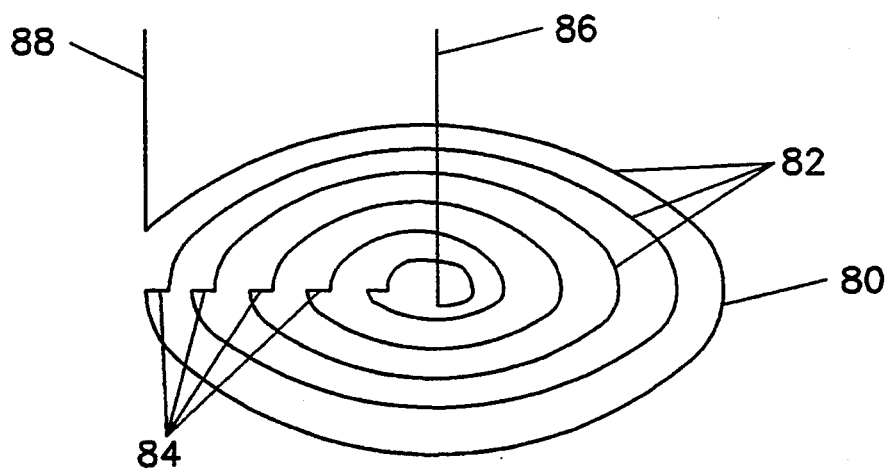

In addition, network 1004 may also tune coil 1002 to resonance at the frequency of source 1008. A matched and tuned condition results in maximum transfer of RF power from the source 1008 to the coil 1002. RF power is radiated by the coil 1002 into the chamber 19 (FIG. 2) where the RF energy causes the process gas to become a plasma.

The coil 1002 has a winding pitch which varies according to the distance from the center such that the windings become more tightly wound further away from the center. A center winding spacing distance 1010 is greater than an outer circumference winding spacing distance 1012. Thus, the winding spacing distances between the spiral coil 1002 turns starts widest at the center 1014 and decreases toward the outer circumference 1016. Ground return connections are illustrated by grounds 1018 and 1020.

Figure 8:
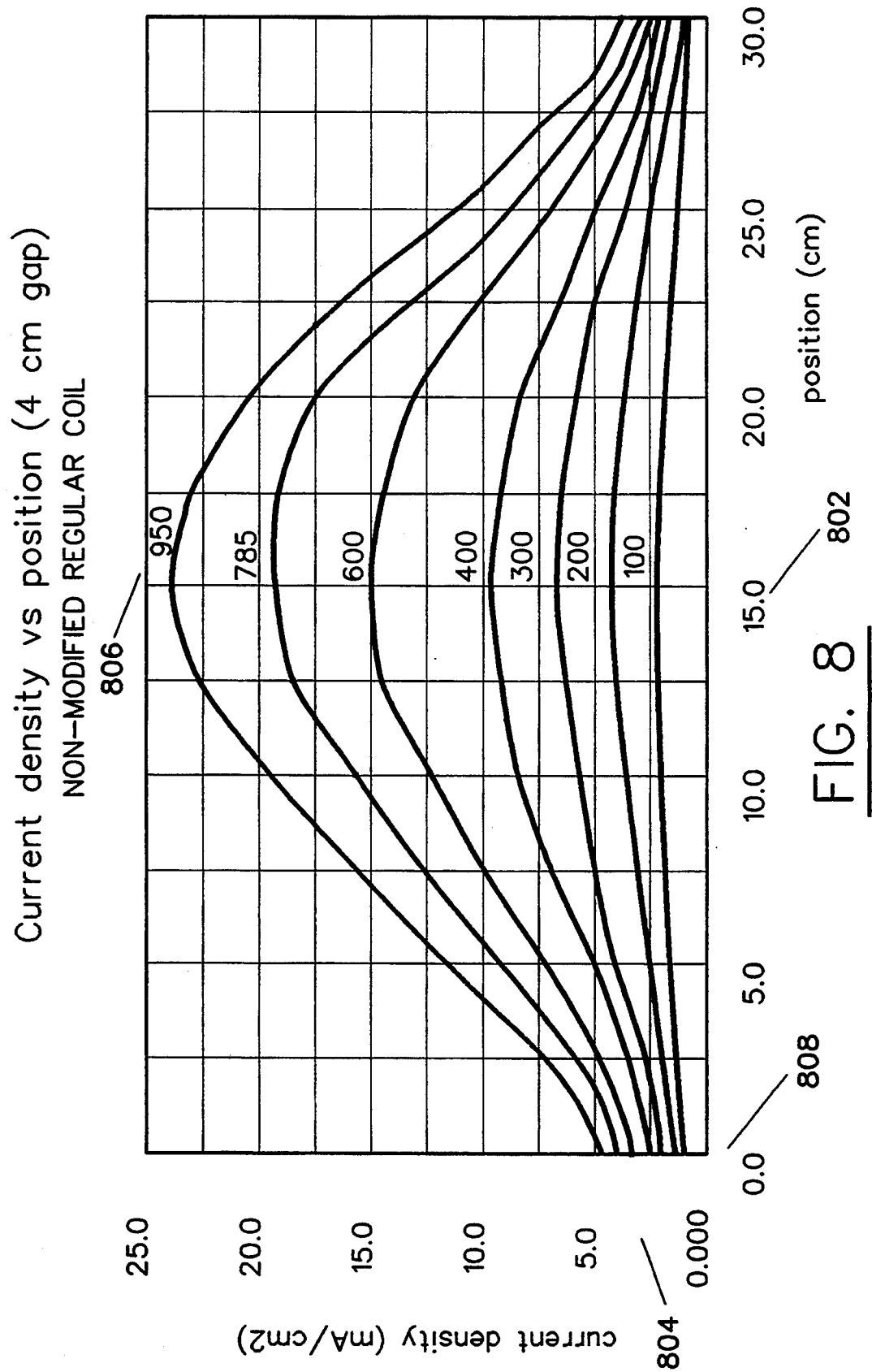
FIG. 8 is a graphical representation of test data taken with the apparatus of FIG. 1.
Figure 9:
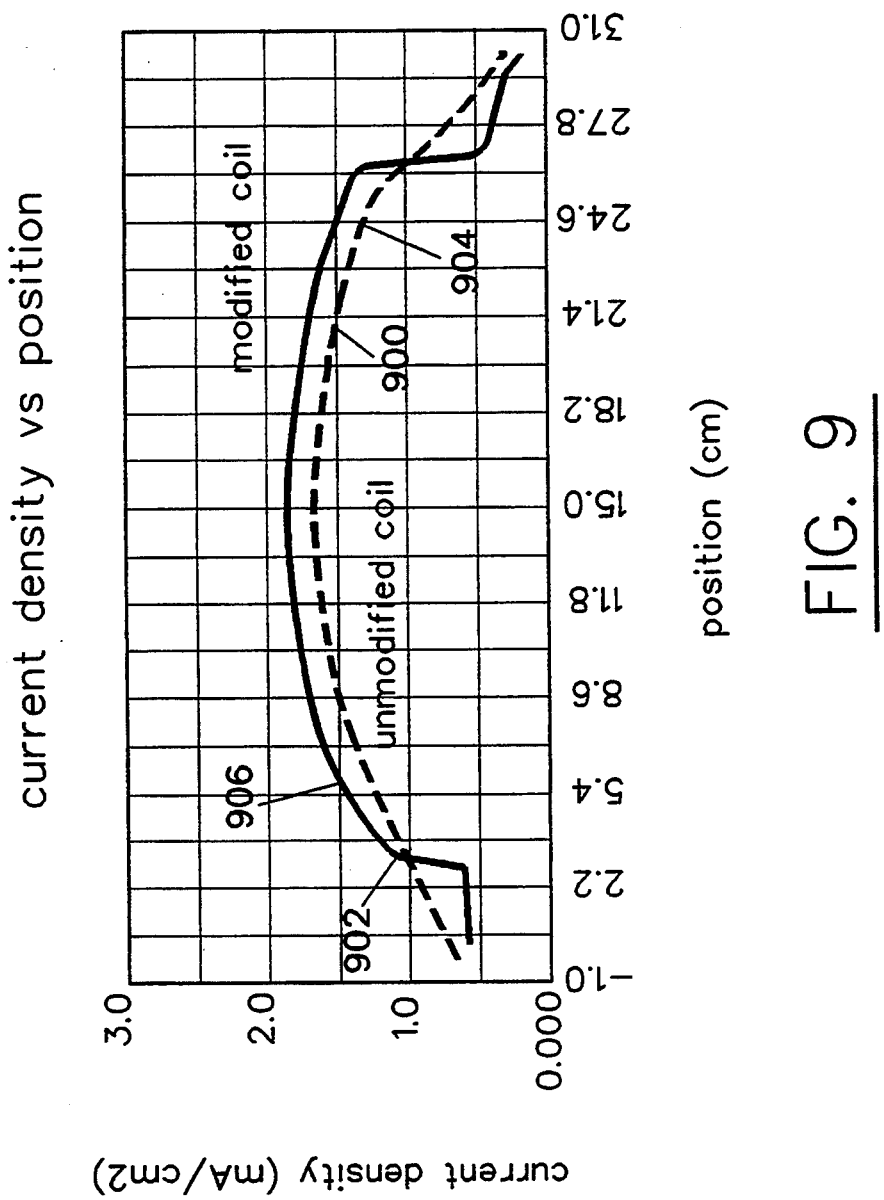
FIG. 9 is a graphical representation of test data taken with the apparatus of FIG. 1 and a modified planar coil in accordance with the present invention.

The coil 1002 produces an RF energy field that is greater toward the outer circumference 1016 than toward the center 1014. Having the RF energy field biased toward the outer circumference of the coil 1002 compensates for the greater plasma energy loses nearer the walls of the housing 12 (FIG. 1). Referring now to FIGS. 8 and 9, current densities of the prior art coil 20 and the coil 1002 of the present invention are graphically illustrated.

The current density of the prior art coil 20 is greatest toward the center region 802. Current densities 804 are illustrated on the vertical axis of the graph for different RF power levels 806 to the coil 20. The variation of the current density is plotted on the horizontal axis of the graph for various distances 808 from one edge of the chamber to the other. Distance 802 is representative of the current density at the center of the coil 20.

The graph of FIG. 9 illustrates the difference in current densities between the unmodified prior art coil 20 and the coil 1002 of the present invention. The current density curve 906 of coil 1002 is greater and more evenly distributed than the current density curve 900 of the prior art coil 20. At end points 902 and 904, the curve 906 has a greater current density than does curve 900. This increase in current density at the outer periphery greatly helps in overcoming the plasma energy loses from the proximate enclosure 12 walls.

Doughnut Coil Configuration

Figure 11:
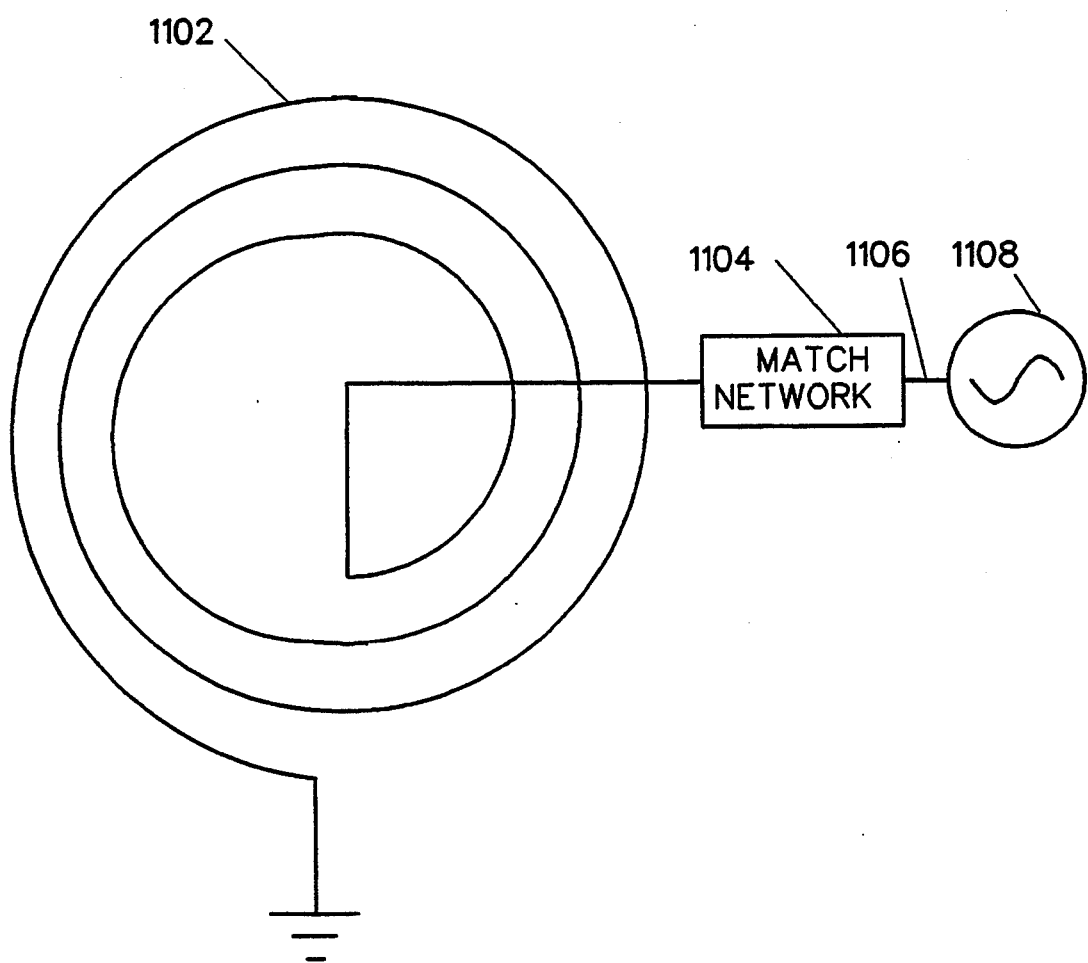
FIG. 11 is a schematic block diagram of a doughnut spiral coil embodiment of the present invention.

Referring now to FIG. 11, a partially spiral coil in the form of a doughnut having coil turns predominately toward the outside radius of the coil is schematically illustrated. The turns in doughnut coil 1102 create a higher density radio frequency field around the periphery of the coil 1102. By careful selection of the number of turns of the coil and the turn spacing 1104, a current density may be configured that results in a uniform plasma density across the entire working surface of the enclosure 12 (FIG. 1).

In similar fashion to the non-uniform spiral coil 1002 described above, radio frequency power from the RF source 1108 is coupled to a matching network 1104 by means of coaxial cable 1106. The matching network 1104 is used to insure maximum transfer of RF power from the source 1108 into the coil 1102. The transferred RF power is radiated from the matched coil 1102 into the process gas flowing into the work chamber 19 (FIG. 2) where the gas becomes plasma.

Doughnut Coil Plus Separate Independently Powered Center Coil

Figure 12:
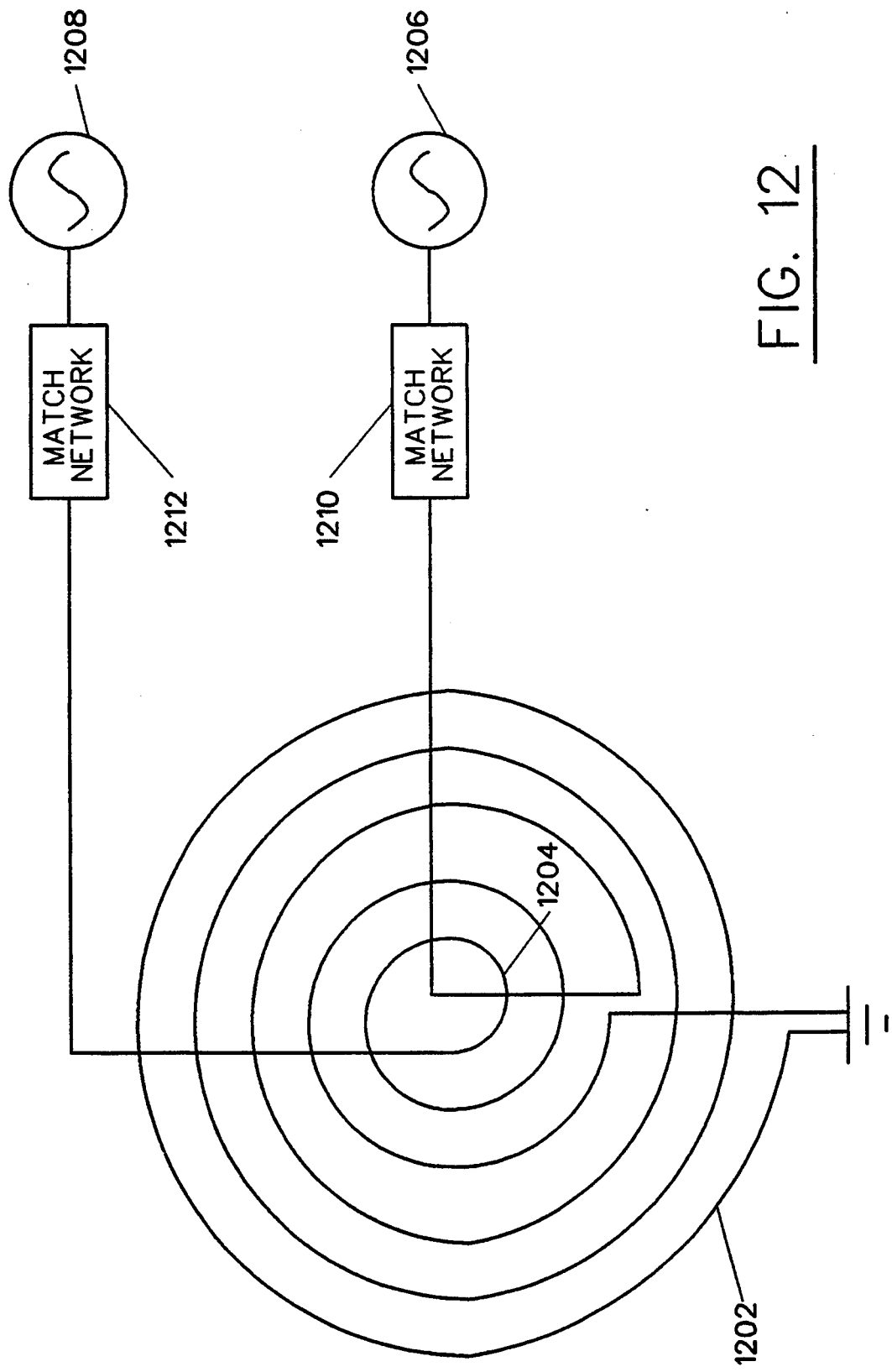
FIG. 12 is a schematic block diagram of a doughnut spiral coil and concentric spiral coil embodiment of the present invention having independent RF power sources.

Referring to FIG. 12, a partially spiral doughnut shaped exterior coil and an interior coil concentric to the exterior coil, both having separate RF sources, are schematically illustrated. The exterior coil 1202 and interior coil 1204 allow a current density pattern to be created that generates a uniform plasma field by adjusting each of the respective RF power sources 1206 and 1208. The power of each of the power sources 1206 and 1208 may be independently adjusted for best current density pattern. RF sources 1206 and 1208 may be phase locked together so as to maintain the same frequency. Phasing of the two RF sources 1206 and 1208 may be adjusted over a 0–180 degree range for fine tuning of the resulting plasma density. Individual matching networks 1210 and 1212 are used to insure maximum transfer of power between the respective RF power sources 1206 and 1208, and the respective coils 1202 and 1204.

Figure 12A:
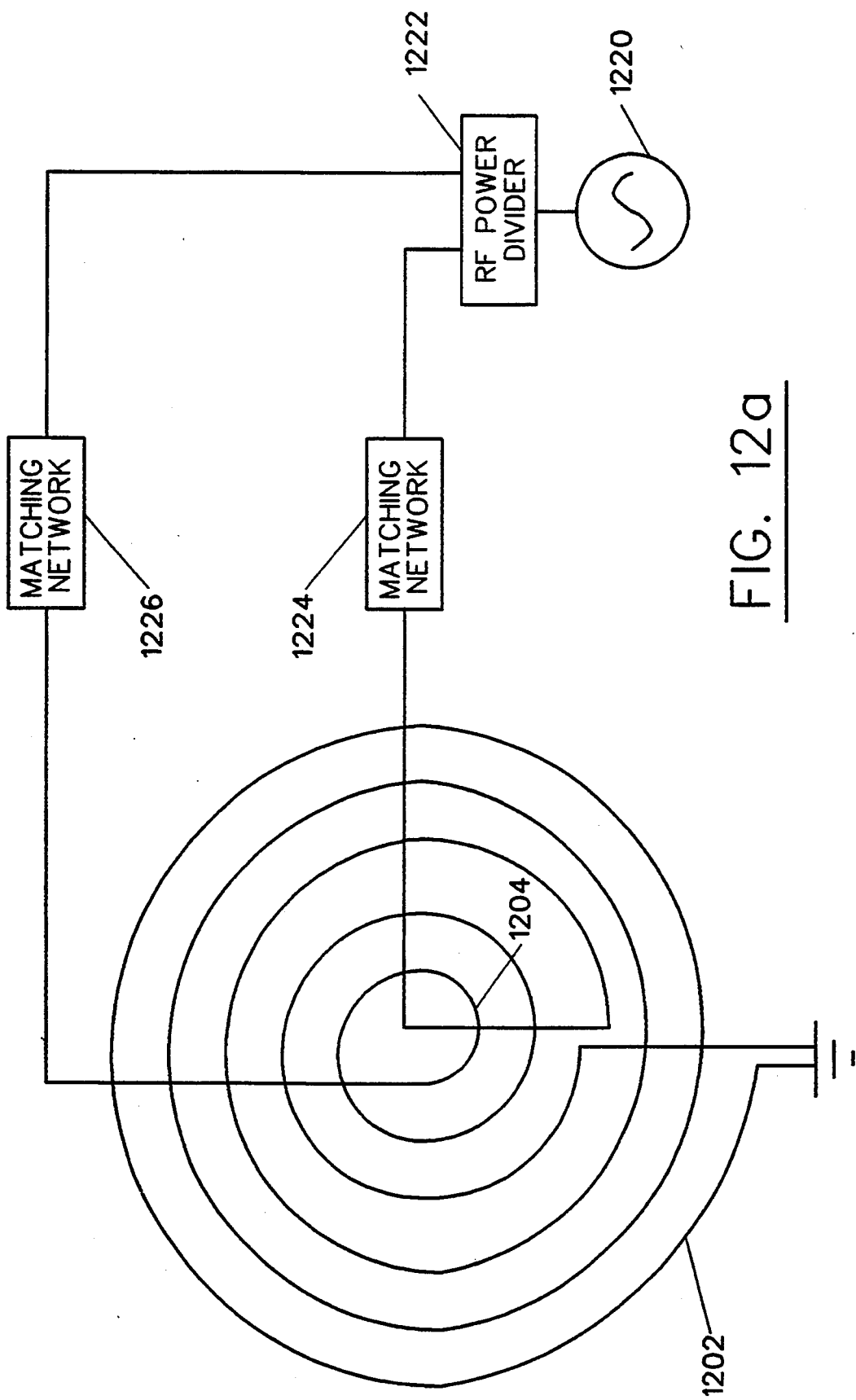
FIG. 12a is a schematic block diagram of a doughnut spiral coil and concentric spiral coil embodiment of the present invention having a common RF power source connected through an adjustable power divider and phasing coaxial cables.

A single RF power source may be utilized with the two coil embodiment of the present invention. Referring now to FIG. 12a, a simplified schematic block diagram of the single RF power source embodiment is schematically illustrated. The power source 1220 connects to an RF power divider 1222 which supplies a portion of the RF power to each matching network 1224 and 1226. The power divider 1222 may be utilized to balance the power distribution between the interior and exterior coils 1204 and 1202, respectively. Phasing between coils may be varied over a 0–180 degree range by varying the length of one of the coaxial cables 1228 or 1230 between the RF power divider 1222 and the respective matching networks 1224 and 1226.

Spiral Coil With Moveable Tap

Figure 13:
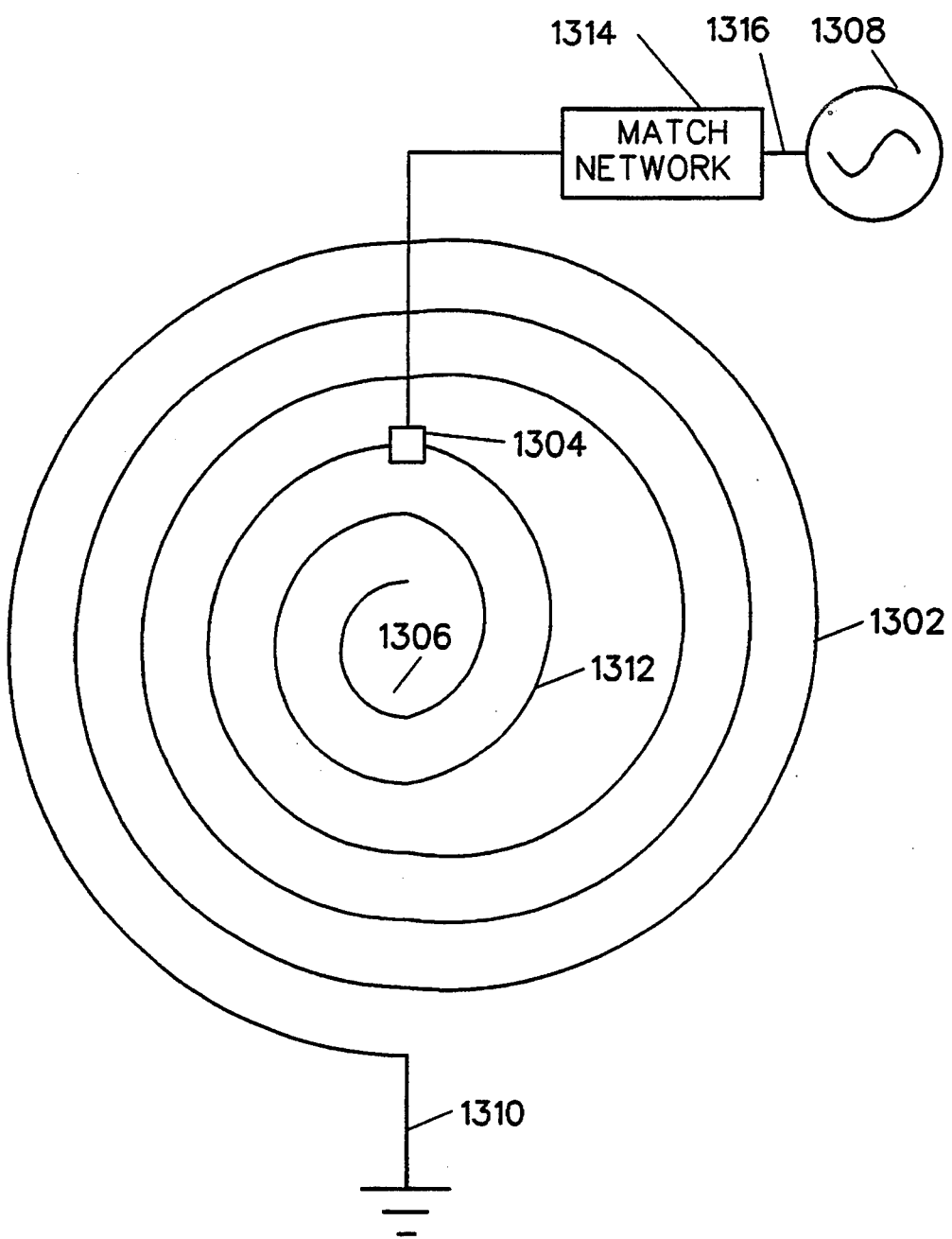
FIG. 13 is a schematic block diagram of a spiral coil embodiment of the present invention having an adjustable tap and connected to an RF power source.

Referring now to FIG. 13, a spiral coil having an adjustable tap connected to an RF power source is schematically illustrated. A spiral coil 1302 has an adjustable tap 1304 biased toward the center 1306 of the coil 1302. The adjustment of the coil tap 1304 creates a radio frequency field that results in a uniform plasma density across the entire working surface of the enclosure 12 (FIG. 1). RF power from the RF source 1308 flows mainly between the tap 1304 connection and ground 1310. The ungrounded portion 1312 of the coil 1302 does not radiate a significant amount of RF power but may produce a phase inversion feedback that beneficially modifies the RF current density toward the center 1306 of the tapped coil 1302.

Radio frequency power from the RF source 1308 is connected to a matching network 1314 by means of a coaxial cable 1316. The matching network 1314 is used to insure maximum transfer of RF power from the source 1308 into the coil 1302. The transferred RF power is radiated from the matched coil 1302 into the process gas flowing into the work chamber 19 (FIG. 2) where the gas becomes plasma.

Figure 14:
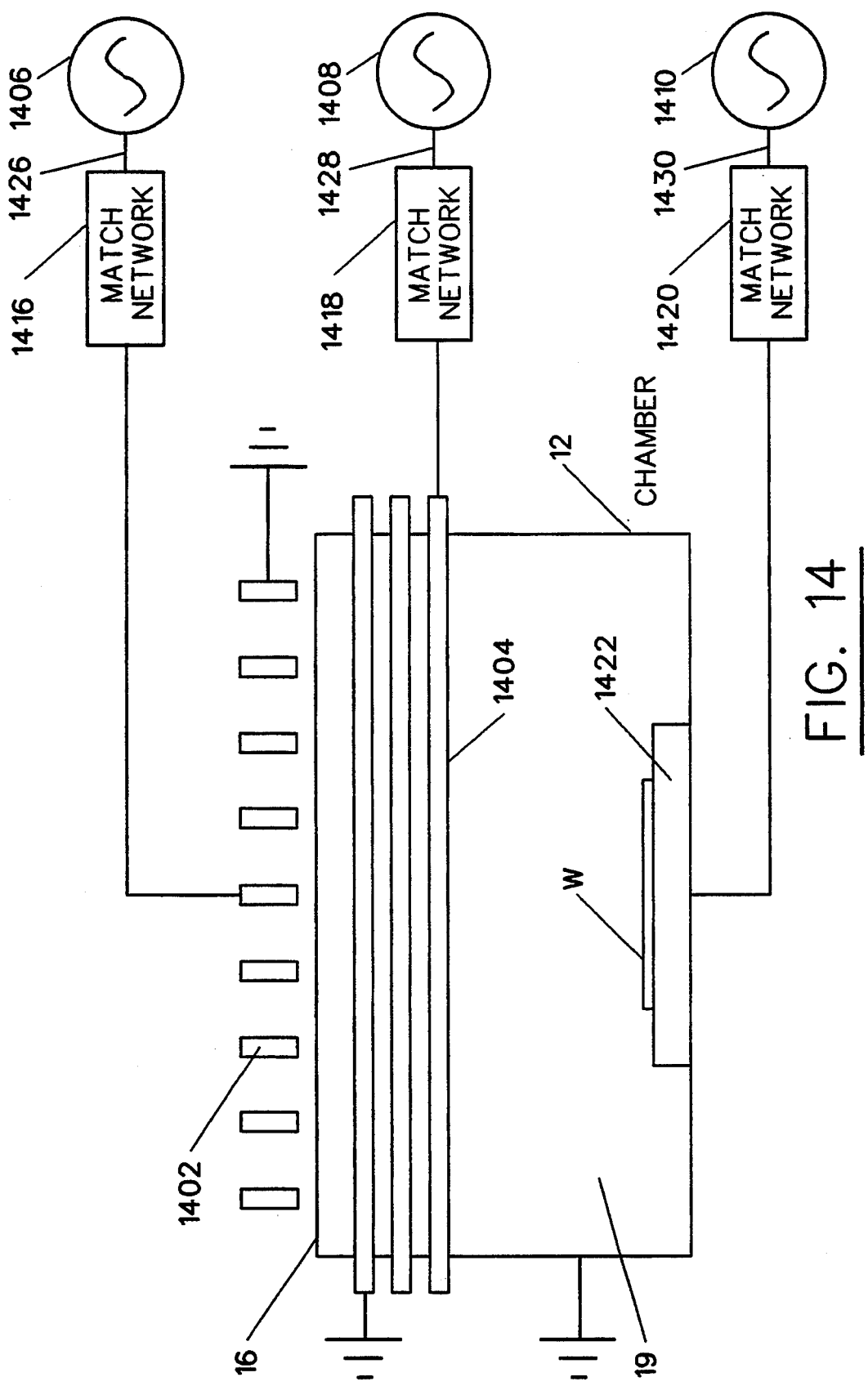
FIG. 14 is a schematic elevational view of an embodiment of the present invention illustrating top and side coils both having independent RF power sources.

Additional Independently powered Coil Around Exterior Wall of Plasma Chamber Referring to FIG. 14, a preferred embodiment of the present invention is illustrated in schematic elevational view. A spiral coil 1402 may be placed on top of the chamber housing 16, and a side coil 1404 may be placed around the side wall of the chamber 12 biased toward the top coil 1402. Independent RF power sources 1406, 1408 and 1410 may be utilized for adjusting the amount of RF introduced into the chamber 12 interior 19 for creation of the plasma. The two power sources 1406 and 1408 may be phase locked together to maintain the same frequency. Phase adjustment of 0–180 degrees may be made between the two RF sources 1406 and 1408 by phase adjustment means well known in the art of signal generators and transmission lines. One RF power source, a power divider and coaxial phasing lines may also be utilized as illustrated in FIG. 12a.

The side coil 1404 adds RF energy to the outer circumference of the plasma field where there is the most plasma energy loss due to the enclosure 12 side wall absorption. Matching networks 1416, 1418 and 1420 are utilized for maximum power transfer from the RF power sources 1406, 1408 and 1410, respectively, which may be, for example, 50 ohms impedance. The matching networks 1416, 1418 and 1420 adjust the impedance of the coils 1402, 1404 and work surface 1422, respectively, to match the typical 50 ohm impedance of the coaxial cables 1426, 1428 and 1430, respectively, which are used to connect the RF power sources 1406, 1408 and 1410, respectively, to the matching networks 1416, 1418 and 1420, respectively.

The RF power source 1410 may be connected to the wafer support 1422 surface to impart plasma energy in a tangential direction to the surface of the wafer W. RF frequencies in the high frequency region of 13.56 MHz, the microwave region of 2.45 GHz, or the low frequency region below 540 KHz, may be utilized separately or in combination to produce a desired result during processing of the integrated circuit wafer W or other objects such as, for example, flat screen display panels (not illustrated).

S-Shaped Coil

Figure 15:
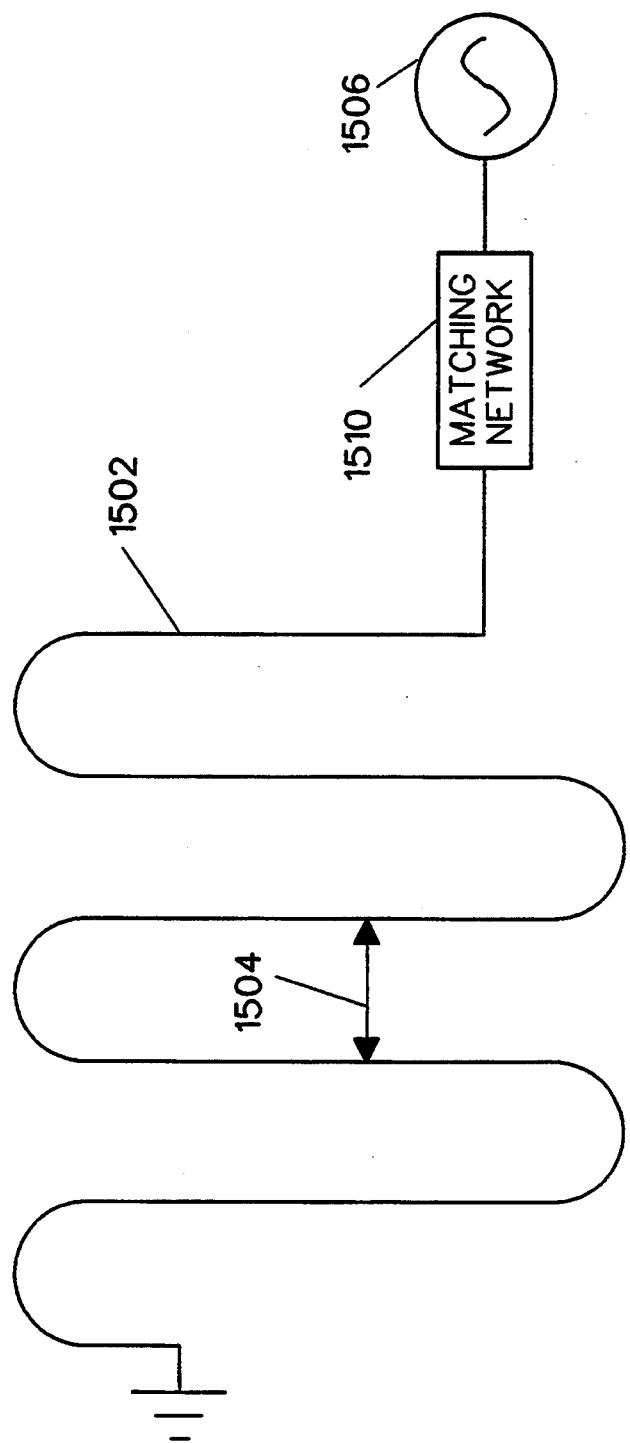
FIG. 15 is a schematic block diagram illustrating an S shaped coil embodiment of the present invention.

Referring now to FIG. 15, an S shaped coil is schematically illustrated. The S shaped coil 1502 more evenly distributes the RF energy into the process gas than does the circular spiral coil 20. The S shaped coil 1502 may be utilized at microwave (2.45 Ghz) or high frequency (13.56 MHz). Adjustment of the spacing 1504 between the turns of the coil 1502 may be used to adjust the RF radiation pattern into the process gas to create a uniformly energized plasma. A matching network 1510 and RF source 1506 are also illustrated and function as mentioned above.

The present invention, therefore, is well adapted to carry out the objects and attain the ends and advantages mentioned, as well as others inherent therein. While a presently preferred embodiment of the invention has been given for purposes of disclosure, numerous changes in the details of construction, interconnection and arrangement of parts will readily suggest themselves to those skilled in the art and which are encompassed within the spirit of the invention and the scope of the appended claims.

What is claimed is:

1. An apparatus for producing a uniformly planar plasma in an inductively coupled plasma system comprised of an enclosure having side walls and a radio frequency transparent face substantially perpendicular to the side walls, means for supplying process gas to be ionized into plasma in the interior of the enclosure, and an interior surface of the enclosure adapted to hold a work piece substantially parallel to the ion plasma flow, said apparatus comprising:

a coil having a variable pitch spiral winding wherein the spacing between the turns of the winding is widest near the center of said coil and the spacing between the turns of the winding progressively decrease away from the center of said coil such that the spacing between the turns of the variable pitch spiral winding is narrower toward the outside radius of said coil than toward its center;

said coil being proximate to the transparent face of the enclosure; and said coil arranged for connection to a radio frequency power source.

2. The apparatus of claim 1, wherein said coil winding is predominately toward the outside radius of the coil.

3. The apparatus of claim 1, further comprising a means for impedance matching between said coil and the radio frequency power source.

4. An apparatus for producing a uniformly planar plasma in an inductively coupled plasma system comprised of an enclosure having side walls and a radio frequency transparent face substantially perpendicular to the side walls, means for supplying process gas to be ionized into plasma in the interior of the enclosure, and an interior surface of the enclosure adapted to hold a work piece substantially parallel to the ion plasma flow, said apparatus comprising:

a first coil arranged for connection to a first radio frequency power source; and a second coil arranged for connection to a second radio frequency power source.

5. The apparatus of claim 4, wherein said first and second coils being proximate to the transparent face of the enclosure, said second coil concentrically positioned within said first coil.

6. The apparatus of claim 4, wherein said first coil being proximate to the transparent face of the enclosure, said second coil being proximate to the side walls of the enclosure and positionally biased toward said first coil.

7. The apparatus of claim 4, wherein the first and second radio frequency power sources have the same frequency, but each having independently adjustable power output and phase.

8. An apparatus for producing a uniformly planar plasma in an inductively coupled plasma system comprised of an enclosure having side walls and a radio frequency transparent face substantially perpendicular to the side walls, means for supplying process gas to be ionized into plasma in the interior of the enclosure, and an interior surface of the enclosure adapted to hold a work piece substantially parallel to the ion plasma flow, said apparatus comprising:

an S shaped coil radiating greater radio frequency energy toward the enclosure side walls than toward the enclosure center, wherein a substantially uniform plasma in the enclosure is thereby generated;

said S shaped coil being proximate to the transparent face of the enclosure; and said S shaped coil arranged for connection to a radio frequency power source.

* * * * *